(12) United States Patent
Zhang et al.

(10) Patent No.: US 9,835,511 B2
(45) Date of Patent: Dec. 5, 2017

(54) HIGH TEMPERATURE FLEXURAL MODE PIEZOELECTRIC DYNAMIC PRESSURE SENSOR

(71) Applicant: ROSEMOUNT AEROSPACE INC., Burnsville, MN (US)

(72) Inventors: Weibin Zhang, Burnsville, MN (US); Anita Fink, Burnsville, MN (US); Kimiko Childress, Farmington, MN (US); Odd Harald Steen Eriksen, Minneapolis, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 93 days.

(21) Appl. No.: 14/707,485

(22) Filed: May 8, 2015

(65) Prior Publication Data

US 2016/0327445 A1   Nov. 10, 2016

(51) Int. Cl.

| *G01L 9/00* | (2006.01) |
|---|---|
| *G01L 9/08* | (2006.01) |
| *H01L 41/113* | (2006.01) |
| *H01L 41/187* | (2006.01) |
| *H01L 41/314* | (2013.01) |
| *H01L 41/27* | (2013.01) |
| *H01L 41/297* | (2013.01) |
| *H01L 41/332* | (2013.01) |
| *H01L 41/337* | (2013.01) |

(52) U.S. Cl.
CPC .............. *G01L 9/008* (2013.01); *G01L 9/08* (2013.01); *H01L 41/1132* (2013.01); *H01L 41/1138* (2013.01); *H01L 41/187* (2013.01); *H01L 41/27* (2013.01); *H01L 41/297* (2013.01); *H01L 41/314* (2013.01); *H01L 41/332* (2013.01); *H01L 41/337* (2013.01)

(58) Field of Classification Search
CPC ...... G01L 9/008; G01L 9/0042; G01L 9/0075
USPC .......................................................... 73/723
See application file for complete search history.

(56) References Cited

U.S. PATENT DOCUMENTS

| 6,617,764 B2 | 9/2003 | Sebastian et al. |
|---|---|---|
| 6,928,878 B1 * | 8/2005 | Eriksen ................. G01L 9/0042 73/724 |
| 7,313,965 B2 | 1/2008 | Tilak et al. |
| 7,414,352 B2 * | 8/2008 | Nanataki ............... B41J 2/14233 310/358 |

(Continued)

FOREIGN PATENT DOCUMENTS

| EP | 2690418 A1 | 1/2014 |
|---|---|---|
| JP | 2003051732 A | 2/2003 |

OTHER PUBLICATIONS

European Search Report for Application No. 16168717.3; dated Sep. 30, 2016; 6 pages.

*Primary Examiner* — David M Gray
*Assistant Examiner* — Andrew V Do
(74) *Attorney, Agent, or Firm* — Cantor Colburn LLP

(57) ABSTRACT

A method for forming a pressure sensor includes forming a base of a sapphire material, the base including a cavity formed therein; forming a sapphire membrane on top of the base and over the cavity; forming a lower electrode on top of the membrane; forming a piezoelectric material layer on an upper surface of the lower electrode, the piezoelectric material layer being formed of aluminum nitride (AlN); and forming at least one upper electrode on an upper surface of the piezoelectric material layer.

10 Claims, 1 Drawing Sheet

(56) References Cited

U.S. PATENT DOCUMENTS

| | | |
|---|---|---|
| 8,460,961 B2 | 6/2013 | Guo et al. |
| 8,519,449 B2 | 8/2013 | Dumitru et al. |
| 2004/0130242 A1 | 7/2004 | Buhler et al. |
| 2004/0246075 A1* | 12/2004 | Bradley .................. H03H 3/04 333/187 |
| 2006/0108896 A1* | 5/2006 | Nanataki ............... H01L 41/098 310/324 |
| 2006/0283255 A1 | 12/2006 | Tilak et al. |
| 2007/0284971 A1 | 12/2007 | Sano et al. |
| 2008/0129150 A1 | 6/2008 | Zhang |

* cited by examiner

HIGH TEMPERATURE FLEXURAL MODE PIEZOELECTRIC DYNAMIC PRESSURE SENSOR

BACKGROUND OF THE INVENTION

This invention relates sensors and, more particularly, to a high temperature flexural mode piezoelectric dynamic pressure sensor.

When pressure (stress) is applied to a material it creates a strain or deformation in the material. In a piezoelectric material this strain creates an electrical charge. This electrical charge can be used as proxy for a pressure being exerted on the piezoelectric material. As such, a diaphragm that is either formed of or carries a piezoelectric material may be supported by a substrate as used as a pressure sensor in certain applications. Such a sensor may be referred to as a flexural mode piezoelectric sensor herein.

Although flexural mode piezoelectric pressure sensors have been widely used. A typical configuration of such a sensor including a sensing film stack comprising a top electrode, a sensing piezoelectric layer and a lower electrode all supported by a diaphragm. The diaphragm is, in turn supported on a substrate that may include a chamber formed therein. Limited by the material's thermal, mechanical and chemical stabilities for piezoelectric layer, electrode, and substrate, and also limited by the method to integrate them as a pressure sensor, most of such traditional piezoelectric pressure sensors are for low temperature applications (T<500C). For example, in some cases, an AlN based high temperature pressure sensor structure while the operation temperature is limited by the silicon based substrate material (T<500° C.). For harsh environmental pressure sensing with high temperature (T>700C), such as in an air craft turbine, such a sensor requires the piezoelectric layer to maintain its piezoelectric property while keeping its dielectric property. Such a sensor would also need to be a piezoelectric material that is electrically, mechanically and chemically stable at high temperature. These requirements exclude most of the commonly used piezoelectric materials, substrate material and even the electrode material.

BRIEF DESCRIPTION OF THE INVENTION

According to one aspect of the invention, a method for forming a flexural mode pressure sensor is disclosed. The method includes: forming a base of a sapphire material, the base including a cavity formed therein; forming a sapphire membrane on top of the base and over the cavity; forming a lower electrode on top of the sapphire membrane; forming a piezoelectric material layer on an upper surface of the lower electrode, the piezoelectric material layer being formed of aluminum nitride (AlN); and forming at least one upper electrode on an upper surface of the piezoelectric material layer.

According to another aspect, a dynamic pressure sensor is disclosed. The sensor includes a base including a lower substrate with a cavity formed therein and a sapphire membrane disposed over the cavity and a lower electrode layer on top of the membrane. The sensor also includes a piezoelectric material layer on an upper surface of the lower electrode, the piezoelectric material layer being formed of aluminum nitride (AlN) and one upper electrode layer on an upper surface of the piezoelectric material layer.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

As briefly described above, it is very difficult to utilize conventional piezoelectric (PZE) material in pressure sensors to be used on high temperature (T>700° C.) environments such as an aircraft turbine. Disclosed herein are a sensor and methods of making the same that can be utilized in such environments. The sensor includes, in one embodiment, a substrate layer made of a wafer stack bonded with single crystal sapphire wafers with certain orientation. The sapphire forms the substrate and the membrane. In one embodiments, the electrode/PZE stack, is formed of such that the lower electrode is made of platinum with predominant <111> orientation, the PZE materiel is a piezoelectric film made of poly-crystal aluminum nitride (AlN) with predominant c-plane orientation and the top electrode is made of also made of platinum.

AlN is a non-ferroelectric material with melting point of 2200° C. and has been reported to maintain its piezoelectric properties up to 1150° C. Sapphire has melting point of 2040° C. and softening point of 1800° C. Both materials are well known by their inert chemical, electrical properties at high temperature. Such materials, however, have not previously been used in high temperature pressure sensors as integrating the two together and forming a substrate of sapphire has proven difficult.

Figure 1:
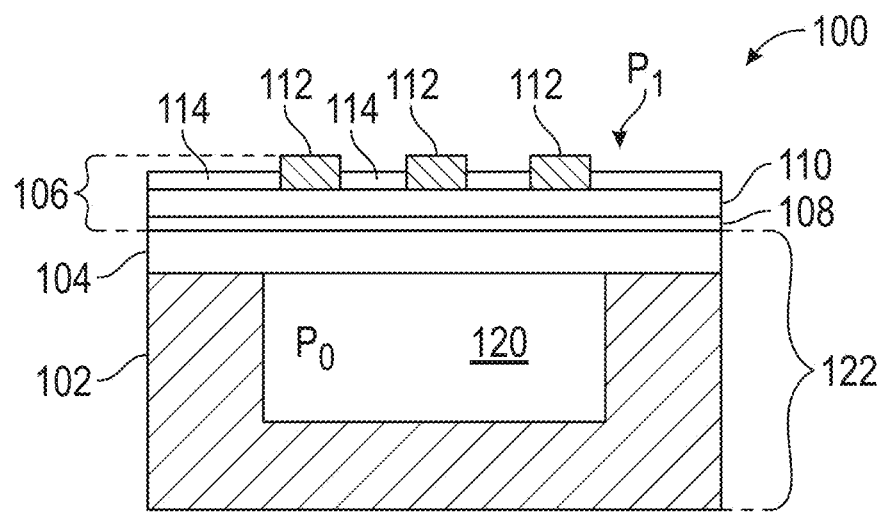
FIG. 1 is side view of one embodiment of pressure sensor.
Figure 2:
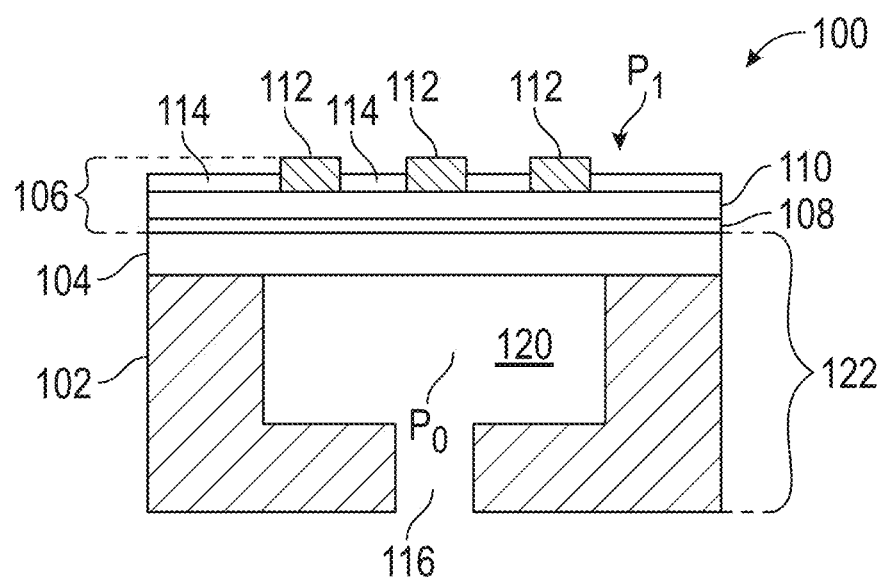
FIG. 2 is side view of another embodiment of pressure sensor.

With reference now to FIGS. 1 and 2, two embodiments of a high pressure PZE sensor 100 are disclosed. The sensor 100 includes a lower substrate 102. The lower substrate 102 may be formed as a sapphire wafer in one embodiment. The lower substrate 102 may be either physically or chemically etched to form a cavity 120 therein. In FIG. 1 the cavity 120 is closed and in FIG. 2 the cavity 120 includes an outlet passage 116. In some cases the cavity 120 in FIG. 1 may be referred to as a blind cavity and the cavity 120 in FIG. 2 may be referred to as a pressure pass cavity. A membrane 104 is disposed on the lower substrate 102. In one embodiment, the membrane 104 is formed of the same material (e.g., sapphire) as the lower substrate 102. In one embodiment, the membrane 104 is formed as a single crystal sapphire wafer. The wafer may have a particular and be chemical-mechanically polished to a certain thickness (20 um-200 um) in one embodiment. In one embodiment, the wafer/membrane 104 is place on top of the lower substrate such that they both exhibit the same orientation and then the two elements are bonded to together. In one embodiment, the bonding is direct wafer bonding at temperature greater than 900° C.

The combination of the membrane 104 and lower substrate 102 forms the base 122 on which the electrode/PZE stack 106 sits. In particular, the electrode/PZE stack 106 includes a lower electrode 108, one or more upper electrodes 112 and a PZE layer 110 disposed between them. Deflection of the membrane 104 into/away from the cavity 120 due to difference in pressure between $P_1$ and $P_0$ will cause a change in voltage/current produced by the PZE layer 110.

In one embodiment, a noble metal is used for the lower electrode 108. For example, one embodiment, platinum (Pt)

is deposited on a surface of the membrane 104 opposite the cavity 120 at temperature 600° C. with predominant <111> orientation (Full width at half maximum (FWHM) Omega <1 degree).

On a side of the lower electrode 108 opposite the chamber, the PZE layer 110 is then formed. In one embodiment, this includes physically depositing an AlN film on the lower electrode 108 at a temperature greater than 300° C. In one embodiment, the deposition is done with a C-plane orientation (FWHM Omega <1.5 degree). In one embodiment, the PZE layer 110 may then be temperature treated to release the stress and improve the adhesion. Optionally a dielectric layer 114 is deposited on AlN. After different patterning and etch steps of the dielectric layer 114 to create contact locations for the upper electrodes 112, one or more upper electrodes 112 may be formed on a top surface of the PZE layer 110.

As discussed above, pressure will be introduced to both side of the diaphragm 108 (shown as $P_1$ and $P_2$). The deformation of the diaphragm 108 caused by the pressure difference results in in-plane strain on the top surface of the diaphragm, which consequently results in an electric charge output due to the piezoelectric effect of the PZE layer.

Embodiments disclosed herein includes sapphire-AlN based flexural mode piezoelectric pressure sensor that combines AlN and sapphire's high temperature properties for harsh environment pressure sensing with temperature greater than 700° C. Advantageously, the process described above is CMOS compatible.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method for forming a flexural mode pressure sensor comprising:
   forming a lower substrate having a cavity formed therein;
   forming a sapphire membrane on top of the lower substrate and over the cavity to form a base;
   forming a lower electrode on top of the membrane;
   forming a piezoelectric material layer on an upper surface of the lower electrode, the piezoelectric material layer being formed of aluminum nitride (AlN);
   forming at least one upper electrode on an upper surface of the piezoelectric material layer; and
   direct bonding the membrane to the lower substrate at a temperature greater than 900° C.;
   wherein the lower substrate has a particular orientation;
   wherein forming the sapphire membrane includes disposing the membrane over the cavity in the same orientation as the lower substrate; and
   wherein forming the lower electrode includes depositing a layer of platinum at a temperature greater than 500° C.

2. The method of claim 1, wherein the membrane is formed as a sapphire wafer that is polished to a thickness of between 20 um and 200 um.

3. The method of claim 1, wherein the platinum is deposited in a predominant <111> orientation.

4. The method of claim 1, wherein forming the piezoelectric material layer includes depositing an AlN film on the lower electrode at a temperature greater than 300° C.

5. The method of claim 4, wherein the AlN film is deposited with a C-plane orientation.

6. The method of claim 1, further comprising:
   depositing a dielectric layer on the piezoelectric film layer; and
   forming patterns in the dielectric layer to create contact locations on the piezoelectric material layer for the at least one upper electrode.

7. A dynamic pressure sensor comprising:
   a base including a lower substrate with a cavity formed therein and a sapphire membrane disposed over the cavity;
   a lower electrode layer on top of the sapphire membrane;
   a piezoelectric material layer on an upper surface of the lower electrode, the piezoelectric material layer being formed of aluminum nitride (AlN); and
   one upper electrode layer on an upper surface of the piezoelectric material layer;
   wherein the lower electrode layer is formed of platinum deposited in a predominant <111> orientation;
   wherein the membrane is formed of the same material as the lower substrate.

8. The sensor of claim 7, wherein the membrane is formed as a sapphire wafer that is polished to a thickness of between 50 um and 125 um.

9. The sensor of claim 7, wherein the membrane is oriented such that it exhibits the same orientation as the lower substrate.

10. The sensor of claim 7, wherein the upper electrode is formed of platinum.

* * * * *